United States Patent [19]
Gillett

[11] Patent Number: 5,168,347
[45] Date of Patent: Dec. 1, 1992

[54] INTEGRATED CIRCUIT CHIP PACKAGE HAVING SIGNAL INPUT/OUTPUT CONNECTIONS LOCATED AT EDGES OF THE SUBSTRATE

[75] Inventor: John B. Gillett, Woodstock, N.Y.

[73] Assignee: International Business Machines Corporation, Armonk, N.Y.

[21] Appl. No.: 873,530

[22] Filed: Apr. 21, 1992

Related U.S. Application Data

[63] Continuation of Ser. No. 675,243, Mar. 26, 1991, abandoned.

[51] Int. Cl.⁵ .......................................... H01L 39/02
[52] U.S. Cl. .................................. 257/691; 361/381; 361/385; 361/386; 257/700; 257/713; 257/714

[58] Field of Search ...................... 357/80, 81, 68, 74; 361/381, 385, 386

[56] References Cited

U.S. PATENT DOCUMENTS 4,970,577 11/1990 Ogihara et al. ...................... 357/80
5,016,138 5/1991 Woodman ........................... 357/80

Primary Examiner—Edward J. Wojciechowicz
Attorney, Agent, or Firm—Robert L. Troike

[57] ABSTRACT

An integrated circuit chip package having a substrate containing integrated circuit chips thereon; signal input/out connections for the chips located at edges of a substrate; and conductive power planes are separated from the signal input/output connections and are removably connected to the substrate.

18 Claims, 3 Drawing Sheets

INTEGRATED CIRCUIT CHIP PACKAGE HAVING SIGNAL INPUT/OUTPUT CONNECTIONS LOCATED AT EDGES OF THE SUBSTRATE

CROSS REFERENCE TO RELATED APPLICATION

This application is a continuation of application Ser. No. 07/675,243, filed Mar. 26, 1991, now abandoned.

DESCRIPTION

1. Technical Field

The present invention is concerned with an integrated circuit chip package and more particularly is concerned with an arrangement whereby the signal wiring and power distribution are separate from each other. In addition, the integrated circuit chip package of the present invention makes it possible to remove the module from the power plane and replace it in the field.

2. Background Art

With the advent of relatively large, high performance integrated circuit systems, continuing efforts are underway to optimize the packaging topology in order to reduce package-caused delays and skews to a minimum. Moreover, the ever increasing desire and demands for speed and integration are significantly and dramatically increasing the amount of current that needs to be supplied to a module. Accordingly, the current topology employed is rapidly approaching a practical limit with respect to combining signal layers having fine line and vias with very heavy power planes in order to distribute the current to the module.

SUMMARY OF INVENTION

An objective of the present invention is to provide a package that exhibits high speed signals along with high current levels at relatively low voltage drop for the power supply.

The present invention provides a package capable of providing the high current levels necessary to power the logic and to reduce the package delays and skews in very large, high performance systems. The package of the present invention provides for separating the signal interconnection function from the power distribution function.

In particular, one aspect of the present invention is concerned with an integrated circuit chip package that comprises a substrate having a plurality of integrated circuit chips on at least one major surface thereof. Signal input/output connections for the integrated circuit chips are located at edges of the substrate. The conductive power planes are separated from the signal input/output connections and are removably connected to the substrate along one surface of the substrate to thereby carry power to the substrate.

Another aspect of the present invention is concerned with the use of two different substrates. This aspect of the present invention includes a first substrate having a plurality of integrated circuit chips on at least one major surface of the first substrate. A second substrate is electrically connected to the first substrate. Signal input/out connections for the integrated circuit chips are located at edges of the second substrate. Conductive power planes are separated from the signal input/output connections and are removably connected to the second substrate along one surface of the second substrate to carry power to the package.

Since no power is carried by the input/output connections in the above package arrangements, the input/output connections such can be optimized for high speed signals consistent with the few milliamps of signal current involved. This makes it possible to employ relatively small contact area, fine traces, and controlled impedances. With respect to the power planes, since no signal lines are involved, the vias in the power planes may be coarse to permit easy fabrication of relatively thick power plane boards, and the connector can be optimized for the purpose of carrying high currents at a relatively low voltage drop.

BEST AND VARIOUS MODES FOR CARRYING OUT INVENTION

Figure 1:
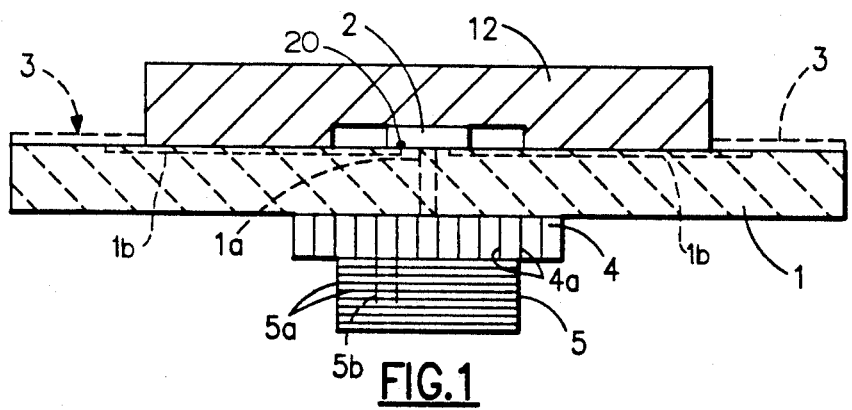
FIG. 1 is a schematic diagram of one embodiment of a package pursuant to the present invention.

In order to facilitate understanding of the present invention, reference will be made to FIGS. 1 - 6, where the same numerals in different figures represent like components of the package. FIG. 1 is a schematic illustration of one of the embodiments of the present invention which employs a ceramic substrate 1 having a plurality of chips 2 on one of the surfaces thereof. The preferred ceramic substrates include silicon oxides and silicates such as aluminum silicate, and aluminum oxides. The chips can be connected to the substrate 1 by any well-known method such as employing solder balls 20. Provided on two of the edges of the substrate 1 are signal input/output connection pads 3 such as gold or copper pads such as in the order of 4000 pads per edge at a one millimeter grid. Although, the signal input/output pads 3 are illustrated in FIG. 1 as being on only one surface of two of the edges of substrate 1, if desired signal input/output pads can be located on both major surfaces of ceramic 1 Contact vias 16 are provided through the substrate 1 between pads 3 and chips 2.

Beneath ceramic substrate 1 is located power connector 4 and power planes 5. Since the substrate is removably connected by the power connector 4 to the power planes 5, such can be removed and replaced in the field when necessary. The power connector 4 can be any known type of connector and typically is a known area array power connector such as a pin/socket arrangement or an elastomeric interposer connector. Elastomeric interposer connectors include synthetic polymeric sheets such as rubber sheets having wires (4A of FIG. 1) vertically embedded therein to transmit power. The ceramic substrate 1 includes contact vias 1a or through holes so that the power can be supplied from the power source Via the power planes 5 and power connectors vertically up underneath the chip (s) through the substrate 1. It is preferred that at least one of the edges of the substrate is to be free of the signal input/output interconnectors so that the power planes may escape in the same general plane as the substrate. Located above the chips is a conventional heat sink or cooling plate arrangement 12. The power planes 5 can be prepared by any of the known techniques in the prior art typical of which is the fabrication of printed circuit cards 5a, but using heavier copper (e.g. — ¼ inch) a coarser grid (e.g. — 0.1 inch) and large vias (e.g. — 30 thousands of an inch).

Figure 2:
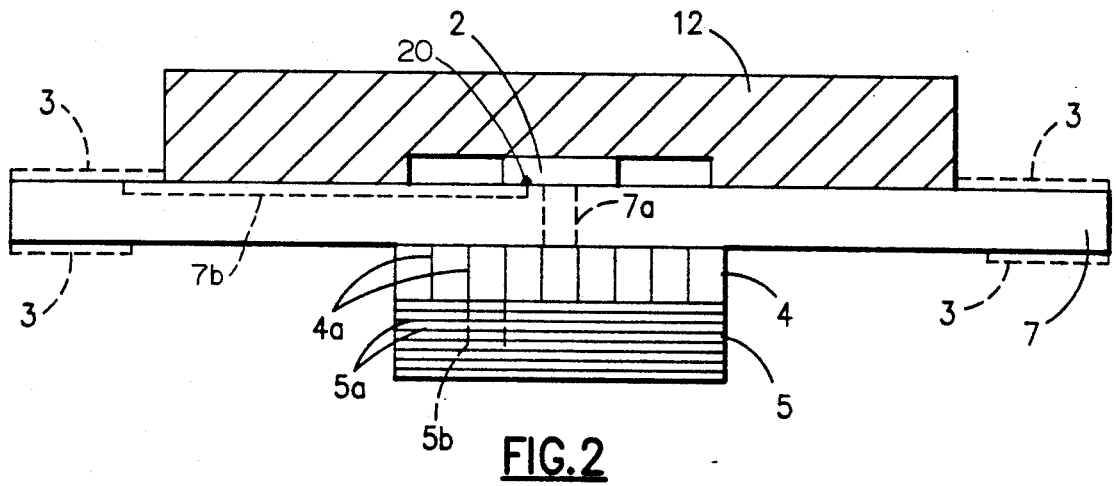
FIG. 2 is a schematic diagram of an alternative embodiment of a package pursuant to the present invention.

Reference to FIG. 2 illustrates another embodiment of a package pursuant to the present invention. The embodiment of FIG. 2 primarily differs from that in FIG. 1 in that the substrate is a printed circuit card 7 having vias 7a therein up to the chips in order that the power can be provided vertically up underneath the chip through the printed circuit card. Printed circuit cards and methods to provide such are well known in the art and need not be described here in any detail.

Figure 3:
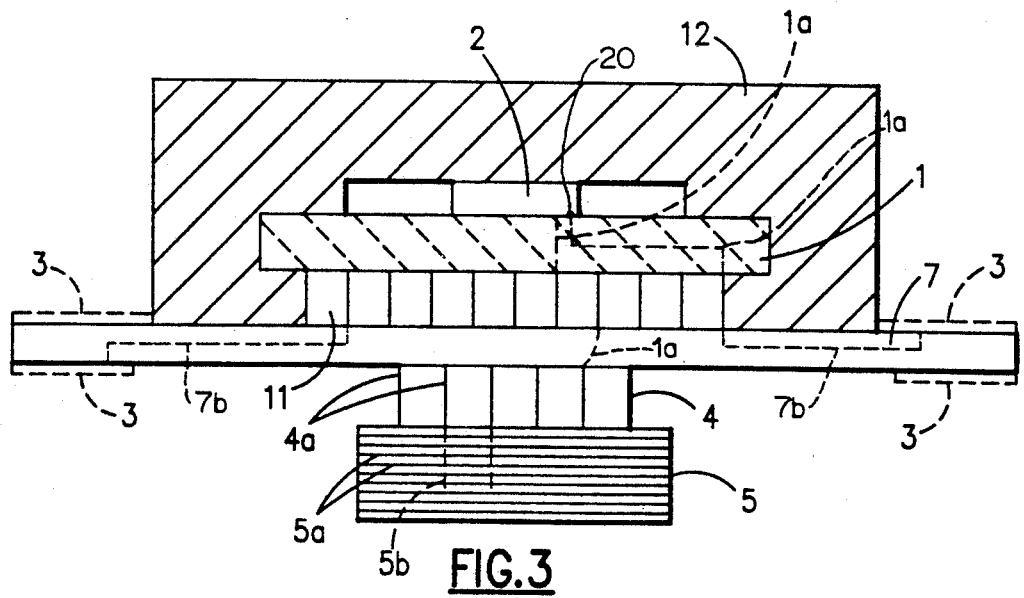
FIG. 3 is another alternative embodiment of a package pursuant to the present invention.

The package illustrated in FIG. 3 employs both a ceramic substrate 1 and a printed circuit card substrate 7. The substrate of the printed circuit card 7 contains the signal input/output connections 3 on edges thereof and the via 7b. The ceramic substrate 1 and printed circuit card substrate 7 are electrically connected to each other through a signal and power connector 11 such as a pin/socket or preferably an elastomeric interposer connector of the type discussed above. The signal and power connector could also be a permanent type connector such as solder balls or can be a separable and removable connector, if desired. The presence of the printed circuit card makes it possible to increase the speed of the signals from the edges as compared to employing a ceramic substrate. On the other hand, compared to printed circuit boards, ceramics are more rigid and chips are more readily adherable to ceramics. The signals at the input/output connections are therefore coupled to the chip 2 through bias 7b, connector 1 and one of the vias 1a separate from a power via.

The power planes 5 are removably connected to the integrated printed circuit board substrate 7 through power plane connectors 4. As discussed above, such connectors can be any area array power connector such as pin/socket type connectors or elastomeric interposer connections.

By employing the particular package arrangement required by the present invention, the signal connections that are brought out to the edge or perimeter of the substrate on at least two opposite sides thereof and terminated in the signal input/output connection can be optimized for high speed signals consistent with the few milliamps of signal current involved. This makes it possible to employ relatively small contact area, fine traces and controlled impedances.

In addition, the vias 5b in the power planes can be relatively coarse which facilitates fabrication of the relatively thick power plane board, and the connector can be optimized for carrying higher currents at a low voltage drop.

Figure 4:
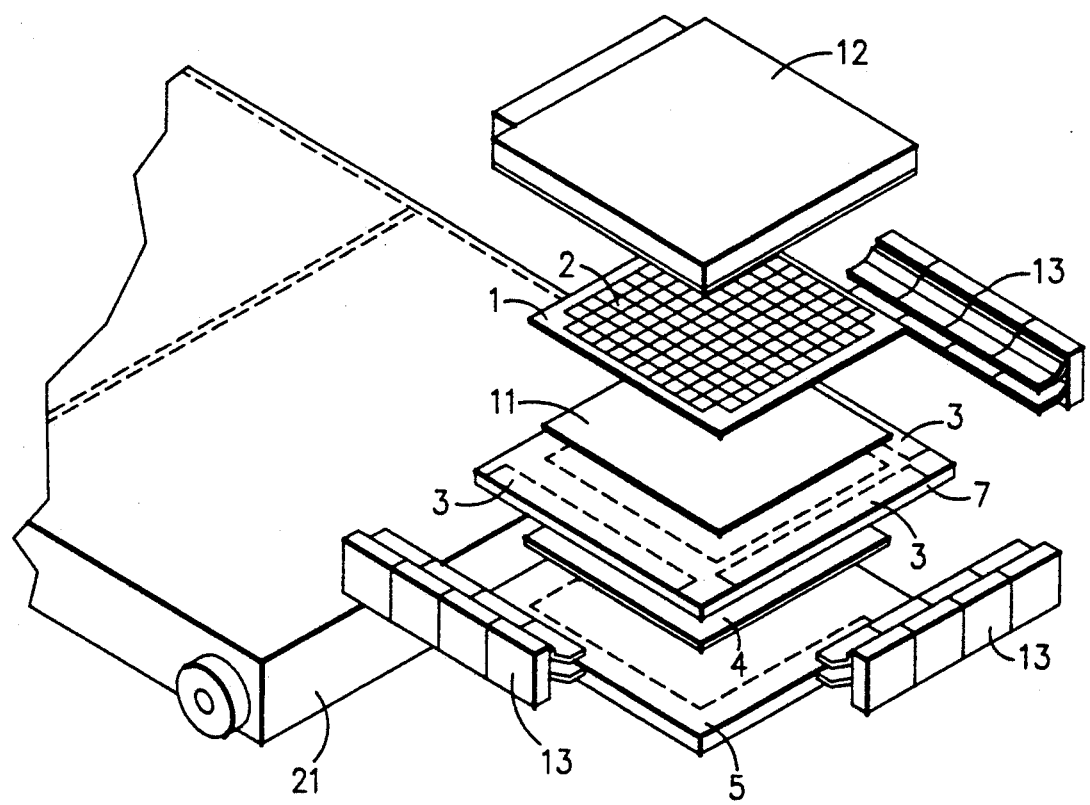
FIG. 4 is an exploded view of the embodiment illustrated by FIG. 3.

FIG. 4 is an exploded view of a module of the embodiment illustrated in FIG. 3. In particular, numeral 1 illustrates the ceramic substrate containing chips 2 thereon. Located above the chips is a conventional heat sink or cooling plate arrangement 12.

An integrated printed circuit card 7 having signal connections 3 on three edges thereof is connected to the ceramic substrate via the area array power and signal connector 11. Power for the signal connections is provided through the flexible signal connectors 13 that mate with the signal input/output connectors 3 on the edges of the printed circuit card 7. Power is provided from the power source 21 to the power planes 5 to the area array power connector 4.

Figure 5:
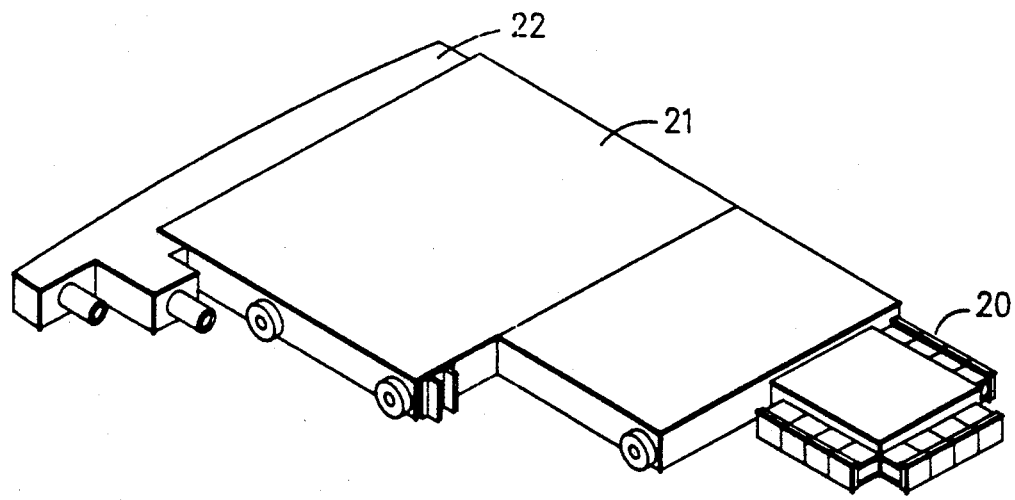
FIG. 5 illustrates connection of the package of the present invention to a power source.

FIG. 5 illustrates an assembled module designated by 20 connected to power source 21 which in turn is maintained at desired temperature employing water cooling illustrated by 22.

Figure 6:
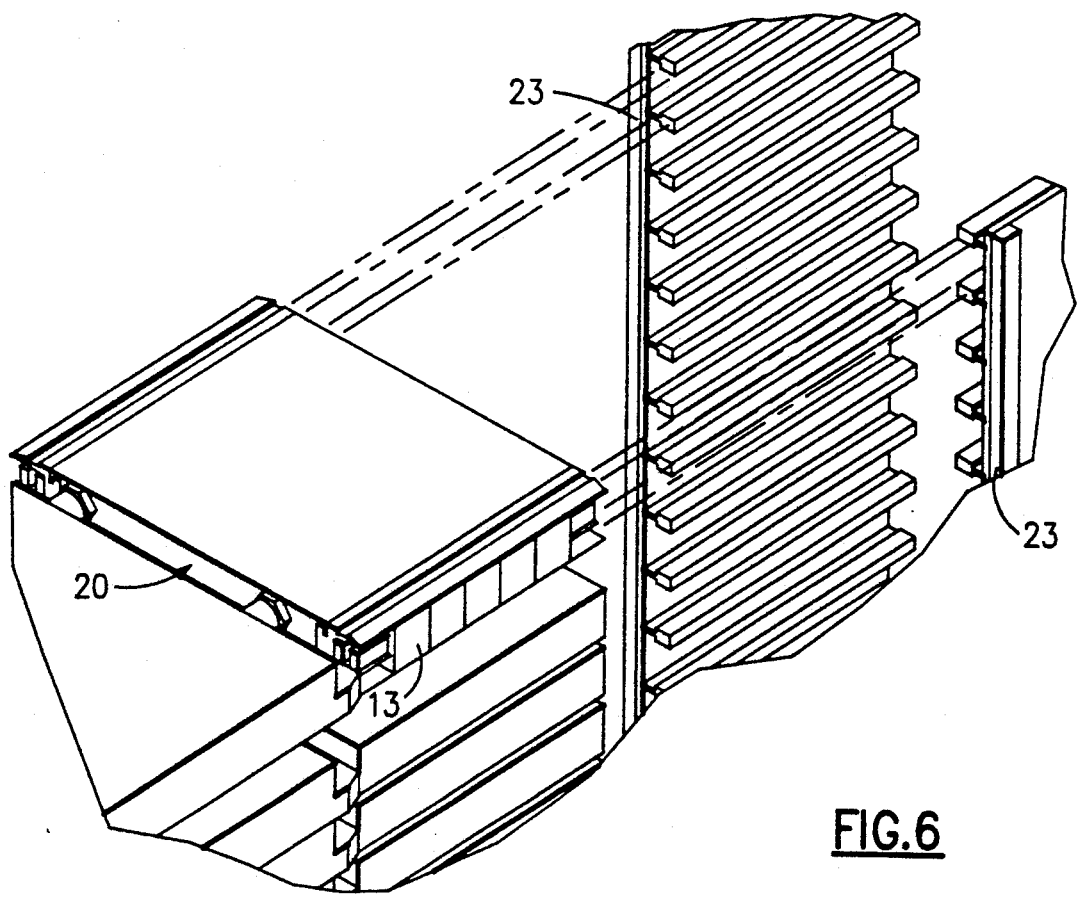
FIG. 6 illustrates one use of the packages of the present invention for connection in a stacked arrangement with other like packages.

FIG. 6 illustrates a module 20 pursuant to the present invention that can be placed between two signal boards 23 in a slidable manner whereby the boards connect through the signal connectors 13 shown.

What is claimed is:

1. An integrated circuit chip package comprising:
   a substrate having a plurality of integrated chips on at least one major surface thereof and having coupling vias therethrough; signal input/output connections for input/output signals for said integrated chips being located at edges of said substrate and coupled to said chips by a first set of said coupling vias; and conductive power planes separated from said signal input/output connections, and means for removably mounting and coupling said conductive power planes to said substrate along a major surface of the substrate to thereby carry power through a second set of said coupling vias to said integrated chips on said substrate.

2. The integrated circuit chip package of claim 1 wherein said substrate is a ceramic.

3. The integrated circuit chip package of claim 1 wherein said substrate is a printed circuit card.

4. The integrated circuit chip package of claim 1 wherein said input/output connections are located on three edges of said substrate.

5. The integrated circuit chip package of claim 1 wherein said input/output connections are located on both surfaces of said substrate.

6. The integrated circuit chip package of claim 1 wherein said power planes are connected to said substrate by an area array power connector.

7. An integrated circuit chip package comprising:
   a first substrate having a plurality of integrated chips on at least one major surface thereof and having coupling vias therethrough to said chips; a second substrate having second substrate coupling vias therethrough and having signal input/output connections for providing input/output signals to the said integrated chips; said input/output connection being located at edges of said second substrate; said input/output connections coupled to first coupling bias of said second substrate coupling vias;
   a power and signal connector interposed and coupled between a major surface of said first and second substrate to couple power through second coupling vias of said second substrate coupling vias at said second substrate and to couple input/output signals at said first coupling vias of said second substrate to said coupling vias in said first substrate; and
   conductive power planes separated from said signal input/output connections, and means for removably mounting and coupling said conductive power planes to said second substrate along a major surface of the said second substrate to thereby carry power through second coupling vias of said second substrate and coupling vias of said first substrate to integrated chips on said package.

8. The integrated circuit chip package of claim 7 wherein said first substrate is a ceramic.

9. The integrated circuit chip package of claim 8 wherein said second substrate is a printed circuit card.

10. The integrated circuit chip package of claim 7 wherein said second substrate is a printed circuit card.

11. The integrated circuit chip package of claim 7 wherein said input/output connections are located on three edges of said second substrate.

12. The integrated circuit chip package of claim 7 wherein said input/output connections are located on both surfaces of said substrate.

13. The integrated circuit chip package of claim 7 wherein said power planes are connected to said substrate by an area array power connector.

14. The chip package of claim 1 wherein said chip package includes means for removably mounting said conductive power planes to said substrate.

15. The chip package of claim 7 wherein said chip package includes means for removably mounting said conductive power planes to said substrate.

16. The integrated chip package of claim 1 including a heat sink mounted to said chips on the surface of said chips opposite said substrate.

17. The integrated chip package of claim 7 including a heat sink mounted to said chips on the surface of said chip opposite said first substrate.

18. In an integrated circuit chip package of the type comprising a substrate having integrated circuit chips on at least one major surface and signal input/output connections for input/output signals for said integrated circuits being located near the edges of said substrate and said substrate having vias therein coupling said input/output connections and power to said integrated circuit chips, the improvement comprising:
    said vias coupling power being separate from vias coupling said input/output connections,
    conductive power planes separated from said signal input/output connections,
    means for removably mounting and removably coupling said conductive power planes to said substrate along a second major surface opposite said one major surface, and
    said vias for coupling power extending between said one major surface and said second major surface at said removable coupling means to thereby carry power from said power planes through said vias for coupling power to said integrated circuit chips on said one major surface of said substrate.

* * * * *